(12) United States Patent
Zhang et al.

(10) Patent No.: US 12,426,419 B2
(45) Date of Patent: Sep. 23, 2025

(54) DISPLAY PANEL AND DISPLAY APPARATUS

(71) Applicants: WUHAN TIANMA MICROELECTRONICS CO., LTD., Wuhan (CN); Wuhan Tianma Microelectronics Co., Ltd. Shanghai Branch, Shanghai (CN)

(72) Inventors: Mengmeng Zhang, Wuhan (CN); Yue Li, Wuhan (CN); Jing Huang, Shanghai (CN)

(73) Assignees: WUHAN TIANMA MICROELECTRONICS CO., LTD., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 569 days.

(21) Appl. No.: 17/821,891

(22) Filed: Aug. 24, 2022

(65) Prior Publication Data
US 2023/0387366 A1    Nov. 30, 2023

(30) Foreign Application Priority Data
May 24, 2022    (CN) .......................... 202210570380.7

(51) Int. Cl.
*H10H 20/857*    (2025.01)
*H10H 20/831*    (2025.01)
*H10H 29/14*    (2025.01)

(52) U.S. Cl.
CPC ...... *H10H 20/857* (2025.01); *H10H 20/8312* (2025.01); *H10H 29/142* (2025.01)

(58) Field of Classification Search
CPC ............. H10H 20/857; H10H 20/8312; H10H 29/142; H10D 86/451; H10D 86/60;
(Continued)

(56) References Cited

U.S. PATENT DOCUMENTS

| | | | | |
|---|---|---|---|---|
| 8,716,715 | B2 * | 5/2014 | Kim ...................... | H10D 86/60 |
| | | | | 257/E21.414 |
| 11,189,679 | B2 * | 11/2021 | Feng .................. | H10K 59/1216 |
| 11,825,706 | B2 * | 11/2023 | Jeon ..................... | H10K 59/123 |

FOREIGN PATENT DOCUMENTS

| | | |
|---|---|---|
| CN | 112585761 A | 3/2021 |
| CN | 112771601 A | 5/2021 |
| CN | 113745245 A | 12/2021 |

OTHER PUBLICATIONS

Chinese Office Action mailed on Oct. 17, 2024, issued in the corresponding Chinese Application No. 202210570380.7, filed on May 24, 2022; 16 pages.

* cited by examiner

*Primary Examiner* — Tan N Tran
(74) *Attorney, Agent, or Firm* — CHRISTENSEN O'CONNOR JOHNSON KINDNESS PLLC

(57) ABSTRACT

A display panel and a display apparatus are provided. The display panel includes a substrate and an array layer at a side of the substrate. The array layer includes pixel circuits and at least one first via. The pixel circuit includes transistors. Each transistor includes an active layer. The active layer includes a channel. The transistor includes a driving transistor and a first switching transistor. In a direction perpendicular to the substrate, a distance between one of the at least one first via and the channel of the driving transistor closest to the first via is greater than a preset distance. A distance between an edge of the one of the at least one first via and an edge of the channel of the first switching transistor closest to the one of the at least one first via is smaller than the preset distance.

23 Claims, 10 Drawing Sheets

(58) Field of Classification Search
CPC ............. H10D 30/6757; G09G 3/3233; G09G 2300/0426; G09G 2300/0819; G09G 2300/0842; G09G 2300/0861; G09G 3/20; G09G 2320/02; H01L 25/167

See application file for complete search history.

DISPLAY PANEL AND DISPLAY APPARATUS

CROSS-REFERENCE TO RELATED APPLICATION

The present application claims priority to Chinese Patent Application No. 202210570380.7, filed on May 24, 2022, the content of which is incorporated herein by reference in its entirety.

TECHNICAL FIELD

The present disclosure relates to the field of display technologies, and, particularly, relates to a display panel and a display apparatus.

BACKGROUND

A display panel includes a pixel circuit and a light-emitting element. The pixel circuit includes a driving transistor and multiple switching transistors. Based on cooperation between the driving transistor and the switching transistor, the pixel circuit transmits a driving current to the light-emitting element to drive the light-emitting element to emit light.

However, when the display panel is displayed at a low frequency, the off-state leakage current of the switching transistor greatly affects stability of a gate potential of the driving transistor, resulting in a change of the conduction degree of the driving transistor, further resulting in observable flickering phenomenon of the display screen of the display panel, thereby deleteriously affecting the display effect under driving in low frequency.

SUMMARY

A first aspect of the present disclosure provides a display panel. The display panel includes a substrate and an array layer located at a side of the substrate. The array layer includes pixel circuits and at least one first via. The pixel circuits each includes transistors. Each of the transistors includes an active layer. The active layer includes a channel. The transistor includes a driving transistor and a first switching transistor. In a direction perpendicular to the substrate, a distance between one of the at least one first via and the channel of the driving transistor closest to the one of the at least one first via is greater than a preset distance. A distance between an edge of one first via of the at least one first via and an edge of the channel of the first switching transistor of one of the pixel circuits that is closest to the one first via is smaller than the preset distance.

A second aspect of the present disclosure provides a display apparatus. The display apparatus includes a display panel. The display panel includes a substrate and an array layer located at a side of the substrate. The array layer includes pixel circuits and at least one first via. The pixel circuits each includes transistors. Each of the transistors includes an active layer. The active layer includes a channel. The transistor includes a driving transistor and a first switching transistor. In a direction perpendicular to the substrate, a distance between one of the at least one first via and the channel of the driving transistor closest to the one of the at least one first via is greater than a preset distance. A distance between an edge of one first via of the at least one first via and an edge of the channel of the first switching transistor of one of the pixel circuits that is closest to the one first via is smaller than the preset distance.

BRIEF DESCRIPTION OF DRAWINGS

In order to better illustrate technical solutions of embodiments of the present disclosure, the accompanying drawings used in embodiments are briefly described below. The drawings described below are merely a part of the embodiments of the present disclosure. Based on these drawings, those skilled in the art can obtain other drawings.

DESCRIPTION OF EMBODIMENTS

In order to better understand the technical solutions of the present disclosure, the embodiments of the present disclosure are described in detail below Referring to the accompanying drawings.

It should be clear that the described embodiments are only some embodiments of the present disclosure, but not all of the embodiments. Based on the embodiments in the present disclosure, all other embodiments obtained by those of ordinary skill in the art without creative efforts fall within the protection scope of the present disclosure.

The terms used in the embodiments of the present disclosure are only for the purpose of describing specific embodiments, and are not intended to limit the present disclosure. As used in the embodiments of the present disclosure and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there can be three relationships, for example, A and/or B, which can indicate that A alone, A and B, and B alone. The character "/" in this document generally indicates that the related objects are an "or" relationship.

Figure 1:
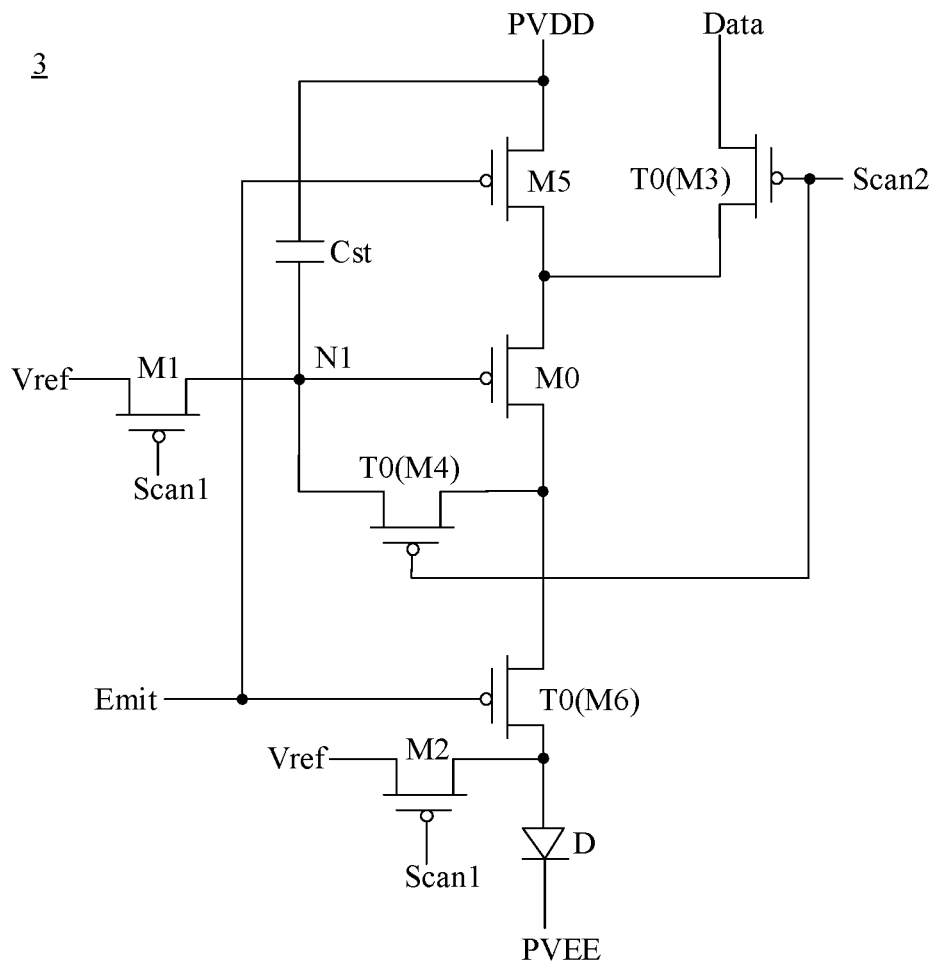
FIG. 1 is a schematic diagram of a pixel circuit provided by some embodiments of the present disclosure.

Before describing the technical solutions of the present disclosure, the present disclosure first takes the pixel circuit shown in FIG. 1 as an example to describe an operating principle of the pixel circuit.

FIG. 1 is a schematic diagram of a pixel circuit provided by some embodiments of the present disclosure. As shown in FIG. 1, the pixel circuit 3 can include a driving transistor M0, a gate reset transistor M1, an anode reset transistor M2, a data writing transistor M3, a threshold compensation transistor M4, a first light-emitting control transistor M5, a second light-emitting control transistor M6, and a storage capacitor C.

The gate reset transistor M1, the anode reset transistor M2, the data writing transistor M3, the threshold compensation transistor M4, the first light-emitting control transistor M5, and the second light-emitting control transistor M6 are switching transistors.

A gate of the driving transistor M0 is electrically connected to a first node N1.

A gate of the gate reset transistor M1 is electrically connected to a first scanning signal line Scan1, a first electrode of the gate reset transistor M1 is electrically connected to a reset signal line Vref, and a second electrode of the gate reset transistor M1 is electrically connected to the first node N1.

A gate of the anode reset transistor M2 is electrically connected to the first scanning signal line Scan1, a first electrode of the anode reset transistor M2 is electrically connected to the reset signal line Vref, and a second electrode of the anode reset transistor M2 is electrically connected to an anode of the light emitting element D.

A gate of the data writing transistor M3 is electrically connected to a second scanning signal line Scan2, a first electrode of the data writing transistor M3 is electrically connected to the data line Data, and a second electrode of the data writing transistor M3 is electrically connected to the first electrode of the driving transistor M0.

A gate of the threshold compensation transistor M4 is electrically connected to the second scanning signal line Scan2, a first electrode of the threshold compensation transistor M4 is electrically connected to the second electrode of the driving transistor M0, and a second electrode of the threshold compensation transistor M4 is electrically connected to the gate of the driving transistor M0.

A gate of the first light-emitting control transistor M5 is electrically connected to a light-emitting control signal line Emit, a first electrode of the first light-emitting control transistor M5 is electrically connected to a power signal line PVDD, and a second electrode of the first light-emitting control transistor M5 is electrically connected to the first electrode of the driving transistor M0.

A gate of the second light-emitting control transistor M6 is electrically connected to the light-emitting control signal line Emit, a first electrode of the second light-emitting control transistor M6 is electrically connected to the second electrode of the driving transistor M0, and a second electrode of the second light-emitting control transistor M6 is electrically connected to the anode of the light-emitting element D.

A first electrode plate of the storage capacitor C is electrically connected to the power signal line PVDD, and a second electrode plate of the storage capacitor C is electrically connected to the first node N1.

Figure 2:
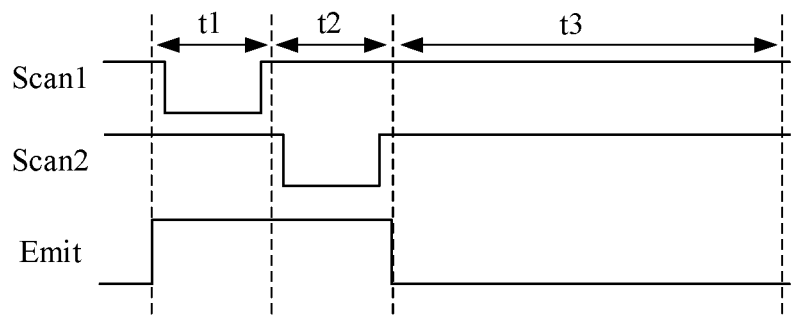
FIG. 2 is a timing sequence diagram corresponding to FIG. 1 provided by some embodiments of the present disclosure.

In conjunction with the timing sequence diagram shown in FIG. 2, a driving cycle of the pixel circuit 3 includes an initialization period t1, a charging period t2, and a light-emitting period t3.

During the initialization period t1, the first scanning signal line Scan1 provides an enable level, the gate reset transistor M1, and the anode reset transistor M2 are turned on, and the gate reset transistor M1 writes the reset voltage provided by the reset signal line Vref into the first node N1, realizing initialization of the potential of the first node N1; and the anode reset transistor M2 writes the reset voltage provided by the reset signal line Vref into the anode of the light-emitting element D, realizing initialization of the anode potential of the light-emitting element D.

During the charging period t2, the second scanning signal line Scan2 provides an enable level, and the data writing transistor M3 and the threshold compensation transistor M4 are turned on and write the data voltage provided by the data line Data into the first node N1, realizing the threshold compensation of the driving transistor M0.

During the light-emitting period t3, the light-emitting control signal line Emit provides an enable level, the first light-emitting control transistor M5 and the second light-emitting control transistor M6 are turned on and transmit the driving current converted by the power voltage provided according to the data voltage and the power supply signal line PVDD, to the light-emitting element D, controlling the light-emitting element D to emit light.

When the display panel displays in low frequency, a holding period of the pixel circuit 3 is relatively long. Therefore, the off-state leakage current of the switching transistor will have a greater impact on the gate potential of the driving transistor M0. For example, under the influence of the off-state leakage current of the gate reset transistor M1, the potential of the first node N1 will leak in a direction of the reset signal line Vref, resulting in the change of the potential of the first node N1, which in turn causes the driving current flowing into the light-emitting element D to deviate from the standard value. Therefore, the display screen of the display panel flickers obviously.

Since the off-state leakage current of the transistor is related to the gate-source voltage of the transistor, the off-state leakage current of the gate reset transistor M1 can be reduced by reducing the gate-source voltage Vgs1 of the gate reset transistor M1, thereby reducing the influence of the off-state leakage current on the potential of the first node N1. During the holding period of the low-frequency driving, the gate-source voltage of the gate reset transistor M1 is $Vgs1=VGH-V_{N1}$, where VGH denotes a voltage of the non-enable level provided by the first scanning signal line Scan1. Since $V_{N1}=V_{Data}-|Vth0|$, where $V_{Data}$ denotes a data voltage, and Vth0 denotes a threshold voltage of the driving transistor M0, the threshold voltage of the driving transistor M0 can be regulated by adjusting process parameters of the transistor, thereby reducing |Vth0|, increasing $V_{N1}$, and decreasing Vgs1.

However, in a process of the display panel, multiple transistors in the pixel circuit 3 are formed synchronously. Therefore, in the related art, it is difficult to adjust the process parameters of only a single transistor, i.e., the driving transistor M0. If it is desired to adjust the threshold voltage of the driving transistor M0 by adjusting the process parameters, the threshold voltages of the other switching transistors will also be regulated. Taking the data writing transistor M3 as an example, after the threshold voltage Vth3 of the data writing transistor M3 is forward biased, |Vth3| decreases, which easily causes the gate-source voltage Vgs3 of the data writing transistor M3 to be close to the turn-on voltage when the second scan signal provided by the second scanning signal line Scan2 is set high. Therefore, a leakage current is generated in the data writing transistor M3, and the leakage current will flow to the first node N1 through the driving transistor M0 and the threshold compensation transistor M4, so that the potential of the first node N1 is increased, thereby reducing the degree of conduction of the driving transistor M0, reducing the driving current generated by the driving transistor M0, and thus causing a dark area of the screen and generating a black ring.

Some embodiments of the present disclosure provide a display panel, which can only positively adjust the threshold voltage of the driving transistor M0 of the pixel circuit and negatively adjust the threshold voltages of other switching transistors, so as to avoid the problem of poor display caused by the positive adjustment of the threshold voltage of switching transistors.

Figure 3:
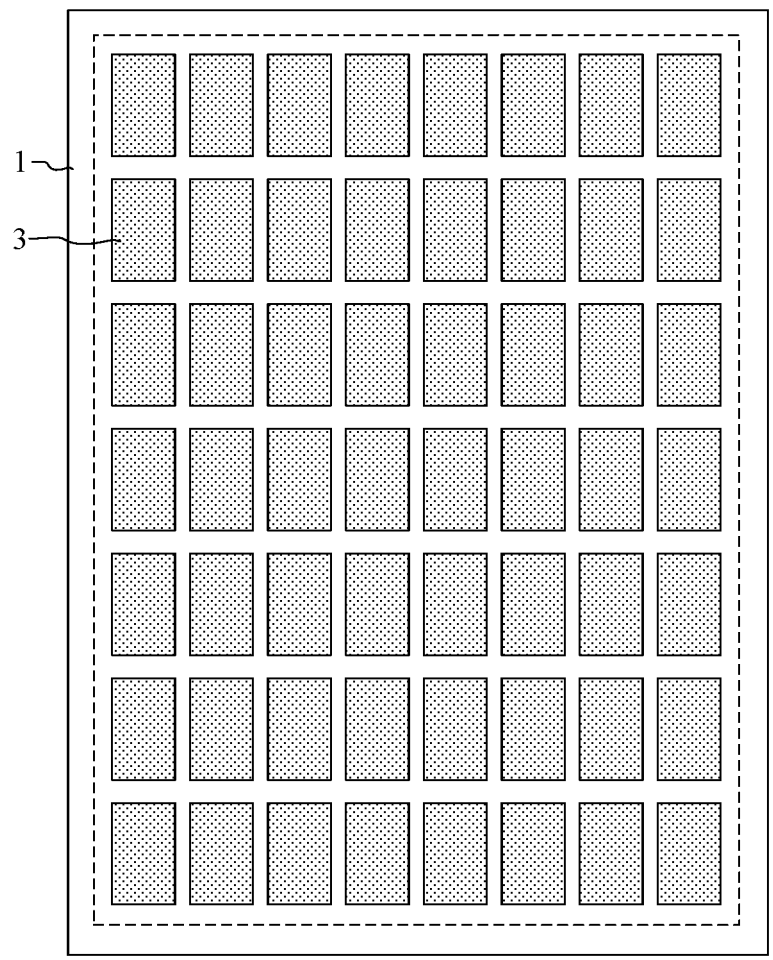
FIG. 3 is a top view of a display panel provided by some embodiments of the present disclosure.
Figure 4:
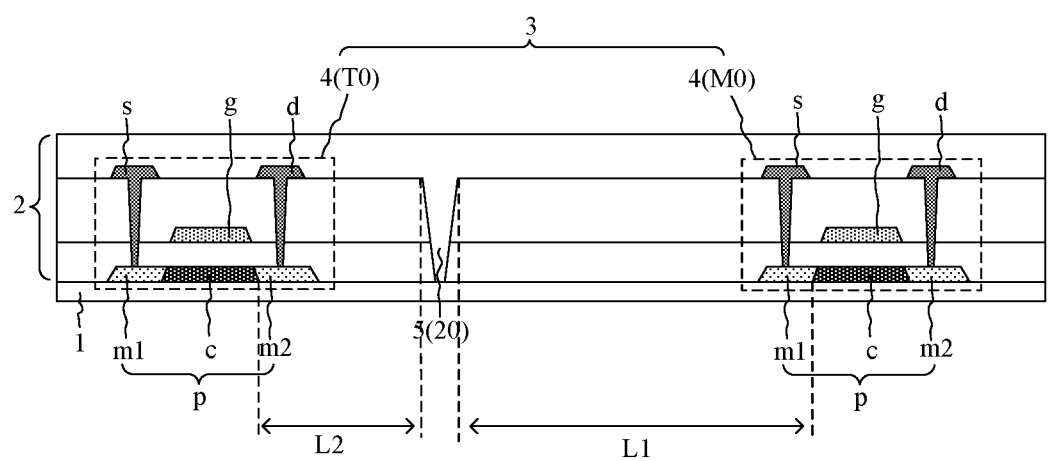
FIG. 4 is a cross-sectional view of a display panel provided by some embodiments of the present disclosure.

FIG. 3 is a top view of a display panel provided by some embodiments of the present disclosure, and FIG. 4 is a cross-sectional view of a display panel provided by some embodiments of the present disclosure. In combination with FIG. 1, as shown in FIG. 3 and FIG. 4, the display panel includes a substrate 1 and an array layer 2 located at a side of the substrate 1.

The array layer 2 includes a pixel circuit 3. The pixel circuit 3 can have the circuit structure shown in FIG. 1. The pixel circuit 3 includes multiple transistors 4. The transistor 4 includes an active layer p. The active layer p includes a channel c. Multiple transistors 4 include a driving transistor M0 and a first switching transistor T0.

The array layer 2 can include a first via 5 penetrating through an insulation layer. In a direction perpendicular to the substrate 1, a distance L1 between the first via 5 and the channel c of the driving transistor M0 closest to the first via 5 is greater than a preset distance. A distance L2 between an edge of the first via 5 and an edge of the channel c of the first switching transistor T0 closest to the first via 5 is smaller than the preset distance.

The distance L2 between the edge of the first via 5 and the edge of the channel c of the first switching transistor T0 being smaller than the preset distance can include two cases. In a first case, referring to FIG. 4, in the direction perpendicular to the substrate 1, the first via 5 is located at the periphery of the first switching transistor T0, and in this case, the distance between the edge of the first via 5 and the edge of the channel c of the first switching transistor T0 refers to the distance between the first via 5 and the channel c of the first switching transistor T0. In a second case, referring to FIG. 5, in the direction perpendicular to the substrate 1, the first via 5 is located inside the first switching transistor T0, and in this case, the distance between the edge of the first via 5 and the edge of the channel c of the first switching transistor T0 can be understood as the distance that the channel c of the first switching transistor T0 exceeds the first via 5.

In the manufacturing process of the display panel, when a via penetrating the insulation layer is provided near the channel c of the transistor, the hydrogen element in the insulation layer penetrated by the via can be discharged, thereby increasing the defects in the channel c of the transistor, and resulting the reverse bias of the threshold voltage of the transistor during operation. The preset distance in the embodiments of the present disclosure can be understood as a distance between the via and the channel c of the transistor when the via has a reverse bias effect on the threshold voltage of the transistor. That is, when the distance between the via and the channel c of the transistor is greater than the preset distance, the distance between the via and the channel c of the transistor is relatively large, and the hydrogen discharging process of the via will not or will hardly affect the threshold voltage of the transistor. When the distance between the via and the channel c of the transistor is smaller than the preset distance, the via and the channel c of the transistor are relatively close, and the hydrogen discharging process of the via will negatively regulate the threshold voltage of the transistor.

As mentioned above, in order to reduce the influence of the off-state leakage current of the switching transistor on the driving transistor M0, the threshold voltage of the driving transistor M0 can be positively regulated by adjusting the process parameters, but the disadvantage of this manner is that it will adjust positively the threshold voltages of other switching transistors synchronously.

In the embodiments of the present disclosure, by setting the first via 5 and making a difference between the distance between the first via 5 and the channel c of the driving transistor M0 and the distance between the first via 5 and the channel c of the first switching transistor T0, the threshold voltage of the first switching transistor T0 can be negatively regulated by the hydrogen discharging process of the first via 5. At this time, even if the threshold voltage of the driving transistor M0 is positively regulated by adjusting the process parameters, the reverse bias effect of the via 5 on the threshold voltage of the first switching transistor T0 can still be used to offset the forward bias effect of adjusting the process parameters on the threshold voltage of the first switching transistor T0, and then the threshold voltage of the first switching transistor T0 is made to be negative. At the same time, since the first via 5 is located beyond the preset distance of the channel c of the driving transistor M0, the first via 5 will not affect the threshold voltage of the driving transistor M0, and the threshold voltage of the driving transistor M0 is still made to be positive under the action of process parameters.

It can be seen that, in the technical solutions provided by the embodiments of the present disclosure, by using the different effects of the first via 5 on the driving transistor M0 and the first switching transistor T0 in the pixel circuit 3, the positive adjustment of the threshold voltage of the driving transistor M0 can be ensured while the threshold voltage of the first switching transistor T0 is negatively regulated, thereby avoiding the phenomenon that the gate potential of the driving transistor M0 is unstable due to the positive adjustment of the threshold voltage of the first switching transistor T0, improving the reliability of the operation of the pixel circuit 3, further improving the display effect under low-frequency driving.

In some embodiments, the preset distance L satisfies 10 µm≤L≤20 µm.

If the value of L is set excessively small, even if the distance between the channel c of the driving transistor M0 and the first via 5 is greater than L, the distance between the channel c of the driving transistor M0 and the first via 5 is still possible to be relatively short, so that the first via 5 negatively regulates the threshold voltage of the driving transistor M0. However, if the value of L is set excessively large, even if the distance between the channel c of the first switching transistor T0 and the first via 5 is smaller than L, the first via 5 can also be far apart from the channel c of the first switching transistor T0, so that the first via 5 cannot affect the threshold voltage of the first switching transistor T0.

When the preset distance is set between 10 μm and 20 μm, the distances between the channel c of the driving transistor M0 and the first via 5, and between the channel c of the first switching transistor T0 and the first via 5 satisfy the above conditions, so that the first via 5 only negatively regulate the threshold voltage of the first switching transistor T0 without affecting the threshold voltage of the driving transistor M0.

In some embodiments, in order to make the influence of the first via 5 on the threshold voltages of the driving transistor M0 and the first switching transistor T0 better achieve the desired effect, L can be set to 10 μm.

In an embodiment, referring to FIG. 4 again, in the direction perpendicular to the substrate 1, at least one first via 5 does not overlap with the first switching transistor T0, that is, this first via 5 is arranged on the periphery of the first switching transistor T0, the manufacturing process of this type of first via 5 is lower, and the distance between the channel c of the first switching transistor T0 and the channel c of the driving transistor M0 is better controlled.

Figure 5:
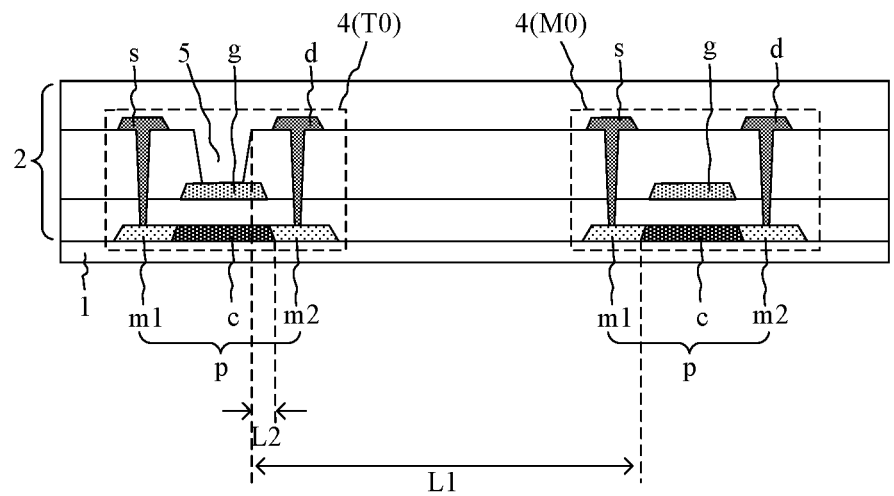
FIG. 5 is a schematic diagram of a first via according to another embodiment of the present disclosure.

FIG. 5 is a schematic diagram of a first via 5 according to another embodiment of the present disclosure. In an embodiment, as shown in FIG. 5, in the direction perpendicular to the substrate 1, at least one first via 5 is located in the channel c of the first switching transistor T0.

This setting method is more suitable for a relatively compact layout design of transistors. For example, in the layout design of pixel circuit 3, if the arrangement between the transistors 4 is relatively compact, there is not too much lateral space to accommodate peripheral vias. By arranging at least one first via 5 to be inside the first switching transistor T0, and on the premise that this first via 5 does not occupy the lateral space, the distance between this first via 5 and the channel c of the driving transistor M0 can be enlarged as much as possible, thereby avoiding the influence of the first via 5 on the threshold voltage of the driving transistor M0, and ensuring the threshold voltage of the driving transistor M0 can be forward biased.

This first via 5 is located above the channel c of the switching transistor, and is relatively close to the channel c, so that the hydrogen element near the channel c can be discharged to a greater extent, thereby having a good negatively regulating on the threshold voltage of the first switching transistor T0.

Figure 6:
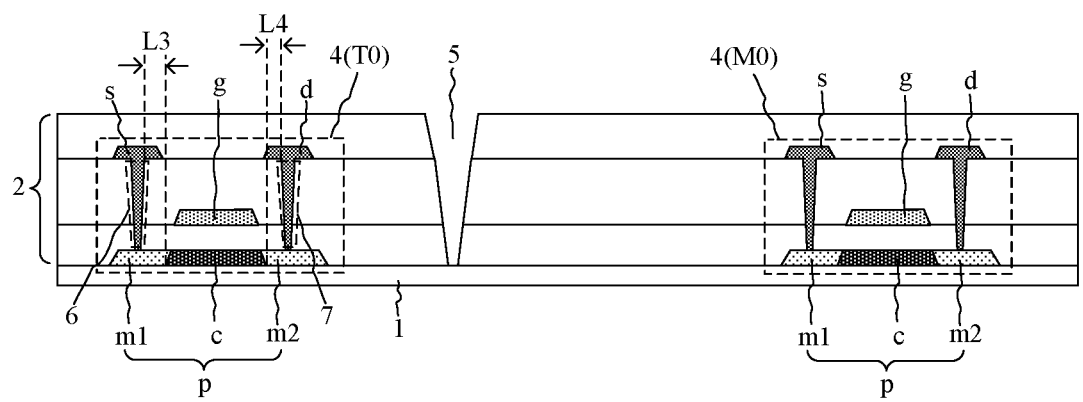
FIG. 6 is a schematic diagram of a first via according to another embodiment of the present disclosure.

FIG. 6 is a schematic diagram of a first via 5 according to another embodiment of the present disclosure. In an embodiment, as shown in FIG. 6, the active layer p includes a first doping region m1 and a second doping region m2. The transistor can include a gate g at a side of the active layer p facing away from the substrate 1, a first electrode s, and a second electrode d. The first electrode s and the second electrode d are located at a side of the gate g facing away from the substrate 1.

The display panel can include a second via 6 and a third via 7. The second via 6 is electrically connected between the first electrode s of the first switching transistor T0 and the first doping region m1. In the direction perpendicular to the substrate 1, the distance L3 between the edge of the second via 6 and the edge of the channel c of the active layer p electrically connected thereto is smaller than the preset distance. The third via 7 is electrically connected between the second electrode d of the first switching transistor T0 and the second doping region m2. In the direction perpendicular to the substrate 1, the distance L4 between the edge of the third via 7 and the edge of the channel c of the active layer p electrically connected thereto is smaller than the preset distance.

Through the above design of the connection vias among the first electrode s, the second electrode d and the active layer p in the first switching transistor T0, the distance between these two connection vias and the channel c of the first switching transistor T0 is smaller than the preset distance. These two connection vias can also have a certain degree of reverse bias influence on the threshold voltage of the first switching transistor T0, thereby offsetting the forward bias effect on the threshold voltage of the first switching transistor T0 due to the adjustment of the process parameters to a greater extent.

In an embodiment, in the direction perpendicular to the substrate 1, for any via that does not overlap with the driving transistor M0, the distance between the via and the channel c of the driving transistor M0 is greater than a preset distance. With such configuration, no peripheral vias are provided within the range of the circle formed with the channel c of the driving transistor M0 as the center and the preset distance L as the radius, that is, the driving transistor M0 has no peripheral vias within the preset distance, so that the reverse bias effect of the via on the driving transistor M0 can be eliminated to a greater extent, ensuring that the threshold voltage of the driving transistor M0 is positively regulated.

Figure 7:
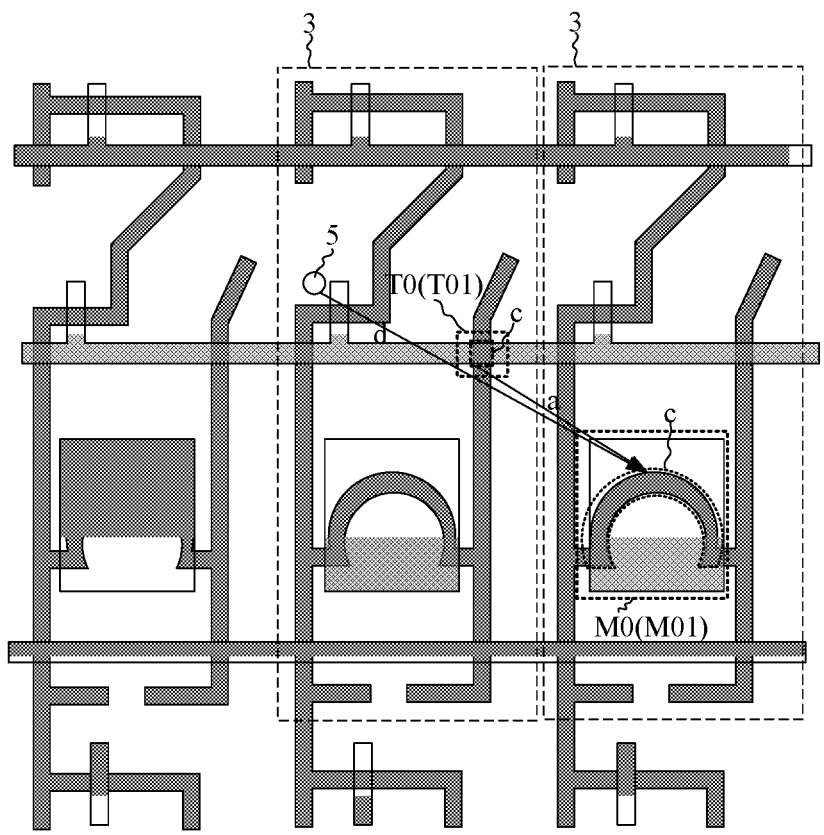
FIG. 7 is a schematic diagram of a location of a first via provided by some embodiments of the present disclosure.
Figure 8:
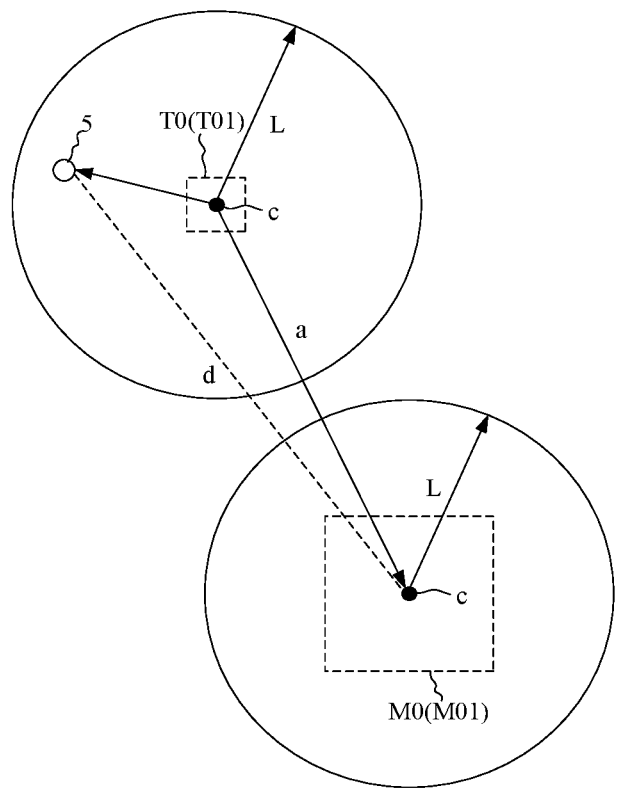
FIG. 8 is an equivalent schematic diagram corresponding to FIG. 7 provided by some embodiments of the present disclosure.

FIG. 7 is a schematic diagram of a location of a first via provided by some embodiments of the present disclosure; and FIG. 8 is an equivalent schematic diagram corresponding to FIG. 7 provided by some embodiments of the present disclosure. In an embodiment, as shown in FIG. 7 and FIG. 8, the first switching transistor T0 includes a first switching sub-transistor T01. The driving transistor M0 includes a first driving sub-transistor M01. The first switching sub-transistor T01 is disposed adjacent to the first driving sub-transistor M01.

The preset distance is L, the distance between the channel c of the first sub-switching transistor T01 and the channel c of the first driving sub-transistor M01 is a', the distance between the channel c of the first driving sub-transistor M01 and the first via 5 closest to the first driving sub-transistor M01 is d', and when a'≥L, d' can satisfy: $L < d' < a' + L$.

In this case, the location of the first via 5 satisfies that the distance between the first via 5 and the channel c of the first sub-switching transistor T01 is smaller than the preset distance, and the distance between the first via 5 and the channel c of the first driving sub-transistor M01 is greater than the preset distance, so that the first via 5 can negatively regulate the threshold voltage of the first switching sub-transistor T01 without affecting the threshold voltage of the first driving sub-transistor M01.

Figure 9:
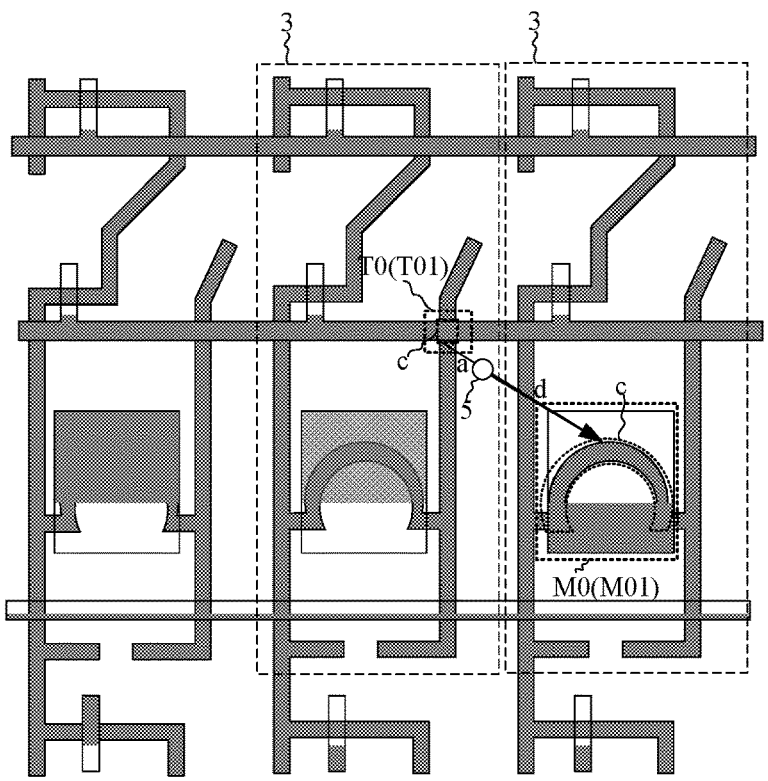
FIG. 9 is a schematic diagram of a location of a first via according to another embodiment of the present disclosure.
Figure 10:
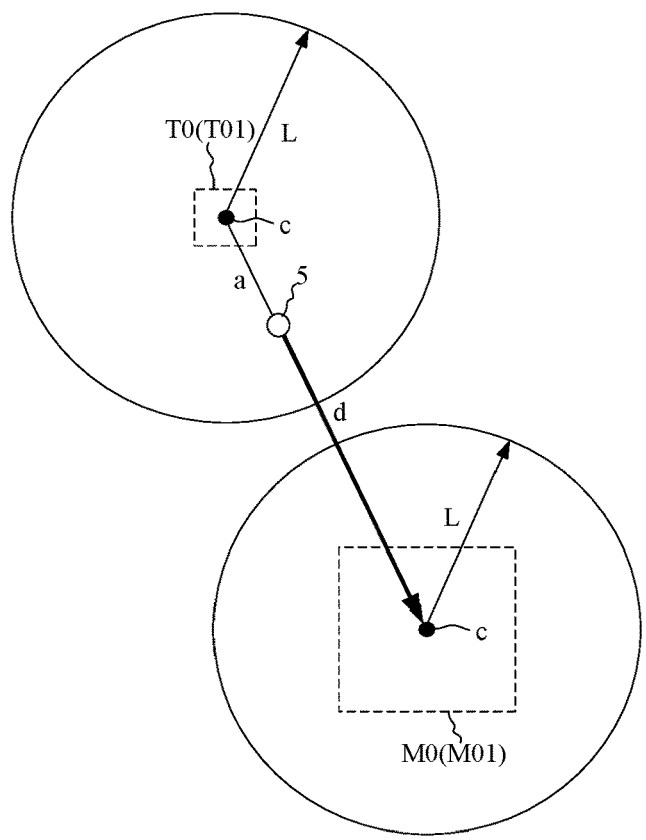
FIG. 10 is an equivalent schematic diagram corresponding to FIG. 9 provided by some embodiments of the present disclosure.

FIG. 9 is a schematic diagram of a location of a first via according to another embodiment of the present disclosure; and FIG. 10 is an equivalent schematic diagram corresponding to FIG. 9 provided by some embodiments of the present disclosure. In another embodiment, as shown in FIG. 9 and FIG. 10, the first switching transistor T0 includes a first switching sub-transistor T01, the driving transistor M0 includes a first driving sub-transistor M01, and the first switching sub-transistor T01 is disposed adjacent to the first driving sub-transistor M01.

The preset distance is L, the distance between the channel c of the first sub-switching transistor T01 and the channel c of the first driving sub-transistor M01 is a', the distance between the channel c of the first driving sub-transistor M01 and the first via 5 closest thereto is d'; and when a'>L, d' can satisfy: d'≥a'−L, and d'>L.

In this case, a location of the first via 5 satisfies that the distance between the first via 5 and the channel c of the first sub-switching transistor T01 is smaller than the preset distance, and the distance between the first via 5 and the channel c of the first driving sub-transistor M01 is greater than the preset distance, so that the first via 5 can negatively regulate the threshold voltage of the first switching sub-transistor T01 without affecting the threshold voltage of the first driving sub-transistor M01.

Referring to FIG. 7 and FIG. 9 again, the first switching sub-transistor T01 and the first driving sub-transistor M01 are located in two adjacent pixel circuits 3, respectively.

When the distance a' between the channel c of the first sub-switching transistor T01 and the channel c of the first driving sub-transistor M01 is greater than or equal to the preset distance L, the first sub-switching transistor T01 is farther from the first driving sub-transistor M01. These two first switching sub-transistors T01 and the first driving sub-transistor M01 are used as transistors in different pixel circuits 3 to design the positions of the first via 5, so as to optimize the layout design under the premise that the first via 5 has different effects on the threshold voltage of these two transistors.

Figure 11:
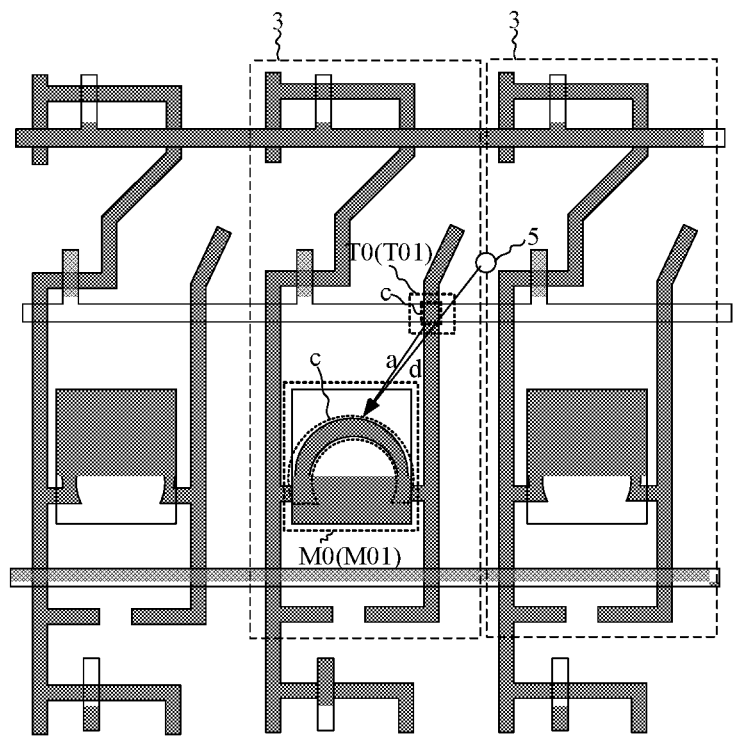
FIG. 11 is a schematic diagram of a location of a first via according to another embodiment of the present disclosure.
Figure 12:
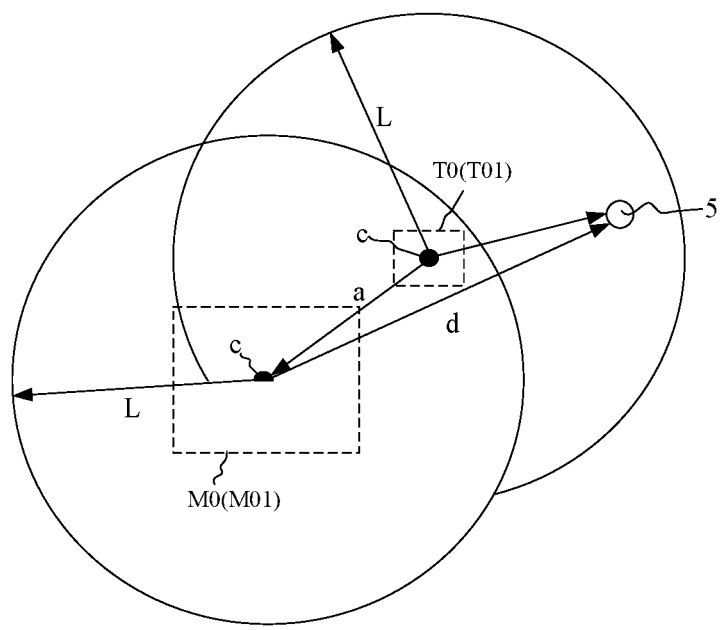
FIG. 12 is an equivalent schematic diagram corresponding to FIG. 11 provided by some embodiments of the present disclosure.

FIG. 11 is a schematic diagram of a location of a first via according to another embodiment of the present disclosure; and FIG. 12 is an equivalent schematic diagram corresponding to FIG. 11 provided by some embodiments of the present disclosure. In another embodiment, as shown in FIG. 11 and FIG. 12, the first switching transistor T0 includes a first switching sub-transistor T01, the driving transistor M0 includes a first driving sub-transistor M01, and the first switching sub-transistor T01 is disposed adjacent to the first driving sub-transistor M01.

The preset distance is L, the distance between the channel c of the first sub-switching transistor T01 and the channel c of the first driving sub-transistor M01 is a', the distance between the channel c of the first driving sub-transistor M01 and the first via 5 closest thereto is d'; and when a'<L, d' can satisfy: L<d'<a'+L.

In this case, the location of the first via 5 satisfies that the distance between the first via 5 and the channel c of the first sub-switching transistor T01 is smaller than the preset distance, and the distance between the first via 5 and the channel c of the first driving sub-transistor M01 is greater than the preset distance, so that the first via 5 can negatively regulate the threshold voltage of the first switching sub-transistor T01 without affecting the threshold voltage of the first driving sub-transistor M01.

In an embodiment, referring to FIG. 11 again, the first switching sub-transistor T01 and the first driving sub-transistor M01 are located in a same pixel circuit 3.

When the distance a' between the channel c of the first sub-switching transistor T01 and the channel c of the first driving sub-transistor M01 is smaller than L, the first sub-switching transistor T01 is relatively close to the first driving sub-transistor M01, and the arrangement of the two transistors is relatively compact. Therefore, these two first switching sub-transistors T01 and the first driving sub-transistor M01 can be used as transistors in the same pixel circuit 3 to design the location of the first via 5, so that the first via 5 affects the threshold voltages of these two transistors differently.

Figure 13:
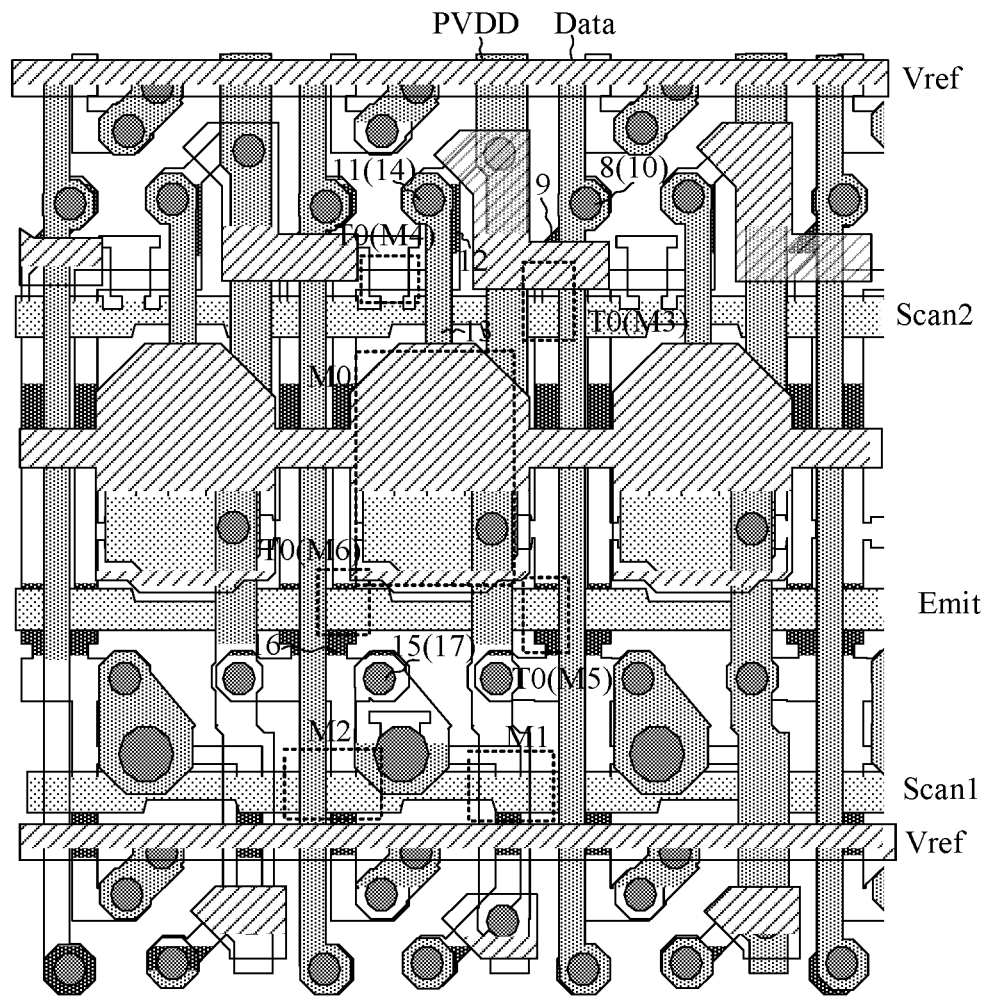
FIG. 13 is a schematic diagram of a layout of a pixel circuit provided by some embodiments of the present disclosure.

In an embodiment, with reference to FIG. 1, as shown in FIG. 13, FIG. 13 is a schematic layout diagram of a pixel circuit 3 provided by some embodiments of the present disclosure, the first switching transistor T0 includes a data writing transistor M3. The data writing transistor M3 is electrically connected between the data line Data and the first electrode of the driving transistor M0. The gate of the data writing transistor M3 is electrically connected to the second scanning signal line Scan2, the first electrode of the data writing transistor M3 is electrically connected to the data line Data, and the second electrode of the data writing transistor M3 is electrically connected to the first electrode of the driving transistor M0.

The first via 5 includes a first sub-via 8. In the direction perpendicular to the substrate 1, the distance between the first sub-via 8 and the channel c of the driving transistor M0 closest to the first sub-via 8 is greater than a preset distance, and the distance between an edge of the first sub-via 8 and an edge of the channel c of the data writing transistor M3 closest to the first sub-via 8 is smaller than the preset distance.

When the first switching transistor T0 includes the data writing transistor M3, the hydrogen discharging process of the first sub-via 8 has a reverse bias effect on the threshold voltage of the data writing transistor M3, so that the threshold voltage of the data writing transistor M3 is negatively regulated, and |Vth3| increases. When the second scan signal provided by the second scanning signal line Scan2 is set high, it is not easy for the gate-source voltage Vgs3 of the data writing transistor M3 to approach the turn-on voltage, so the leakage of the data line Data to the first node N1 can be reduced, improving the black ring phenomenon.

In some embodiments, referring to FIG. 13 again, the data writing transistor M3 is electrically connected to the data line Data through the first connection line 9. The first sub-via 8 includes a first connection via 10 electrically connected between the first connection line 9 and the data line Data.

It can be understood that the first connection via 10 is an original connection via in the pixel circuit 3 to realize the electrical connection between the data writing transistor M3 and the data line Data. The location of the first connection via 10 is regulated so that the distance between the first connection via 10 and the channel c of the data writing transistor M3 is smaller than the preset distance, and the distance between the first connection via 10 and the channel c of the driving transistor M0 is greater than the preset distance, so that the threshold voltage of the data writing transistor M3 can be negative directly by using the original connection via in the panel, and no additional vias need to be added in this case.

In an embodiment, referring to FIG. 1 and referring to FIG. 13 again, the first switching transistor T0 includes a threshold compensation transistor M4 electrically connected between the second electrode of the driving transistor M0 and the gate of the driving transistor M0. For example, the gate of the threshold compensation transistor M4 is electrically connected to the second scanning signal line Scan2, the first electrode of the threshold compensation transistor M4 is electrically connected to the second electrode of the driving transistor M0, and the second electrode of the threshold compensation transistor M4 is electrically connected to the gate of the driving transistor M0.

The first via 5 includes a second sub-via 11. In the direction perpendicular to the substrate 1, the distance between the second sub-via 11 and the channel c of the driving transistor M0 closest thereto is greater than a preset distance, and the distance between the edge of the second sub-via 11 and the edge of the channel c of the threshold compensation transistor M4 closest thereto is smaller than the preset distance.

When the first switching transistor T0 includes the threshold compensation transistor M4, the hydrogen discharging process of the second sub-via 11 has a reverse bias effect on the threshold voltage of the threshold compensation transistor M4, so that the threshold voltage of the threshold compensation transistor M4 is reverse biased, |Vth4| increases. When the second scan signal provided by the second scanning signal line Scan2 is set high, it is not easy for the gate-source voltage Vgs4 of the threshold compensation transistor M4 to approach the turn-on voltage, so the leakage of the data line Data to the first node N1 can be reduced, improving the black ring phenomenon.

In some embodiments, referring to FIG. 13 again, the threshold compensation transistor M4 is electrically connected to the gate of the driving transistor M0 through the second connection line 12 and the third connection line 13. The second sub-via 11 includes a second connection via 14 electrically connected between the second connection line 12 and the third connection line 13. The second connection line 12 and the third connection line 13 are disposed in different layers. The second connection line 12 is in the same layer as the active layer p. The third connection line 13 is in the same layer as the data line Data.

It can be understood that the second connection via 14 is an original connection via in the pixel circuit 3 for realizing the electrical connection between the threshold compensation transistor M4 and the driving transistor M0. The location of the second connection via 14 is regulated so that the distance between the second connection via 14 and the channel c of the threshold compensation transistor M4 is smaller than the preset distance, while the distance between the channels c of the driving transistor M0 is greater than the preset distance. Therefore, the threshold voltage of the threshold compensation transistor M4 can be negative directly by using the original connection via in the panel, and no additional vias need to be added at this time.

In an embodiment, referring to FIG. 1 and referring to FIG. 13 again, the first switching transistor T0 includes a second light-emitting control transistor M6 electrically connected between the second electrode of the driving transistor M0 and the light-emitting element between D. For example, the gate of the second light-emitting control transistor M6 is electrically connected to the light-emitting control signal line Emit, the first electrode of the second light-emitting control transistor M6 is electrically connected to the second electrode of the driving transistor M0, and the second electrode of the second light-emitting control transistor M6 is electrically connected to the anode of the light-emitting element D.

The first via 5 includes a third sub-via 15. In the direction perpendicular to the substrate 1, a distance between the third sub-via 15 and the channel c of the driving transistor M0 closest thereto is greater than a preset distance, and a distance between the edge of the third sub-via 15 and the edge of the channel c of the second light emitting control transistor M6 closest thereto is smaller than the preset distance.

When the first switching transistor T0 includes the second light-emitting control transistor M6, the third sub-via 15 negatively regulates the threshold voltage of the second light-emitting control transistor M6, and negatively regulates the threshold voltage of the second light-emitting control transistor M6, which can prevent the data line Data from leaking electricity to the light-emitting element D, thereby avoiding undesirable light-emitting of the light-emitting element D, and improving the phenomenon that the black state is not black.

In some embodiments, referring to FIG. 13 again, the second light-emitting control transistor M6 is electrically connected to the light-emitting element D through the fourth connection line 16. The third sub-via 15 includes a third connection via 17 electrically connected between the fourth connection line 16 and the light-emitting element D, so that the threshold voltage of the second light-emitting control transistor M6 can be negative by using the original connection via in the panel, at this time, there is no need to provide other additional vias.

Figure 14:
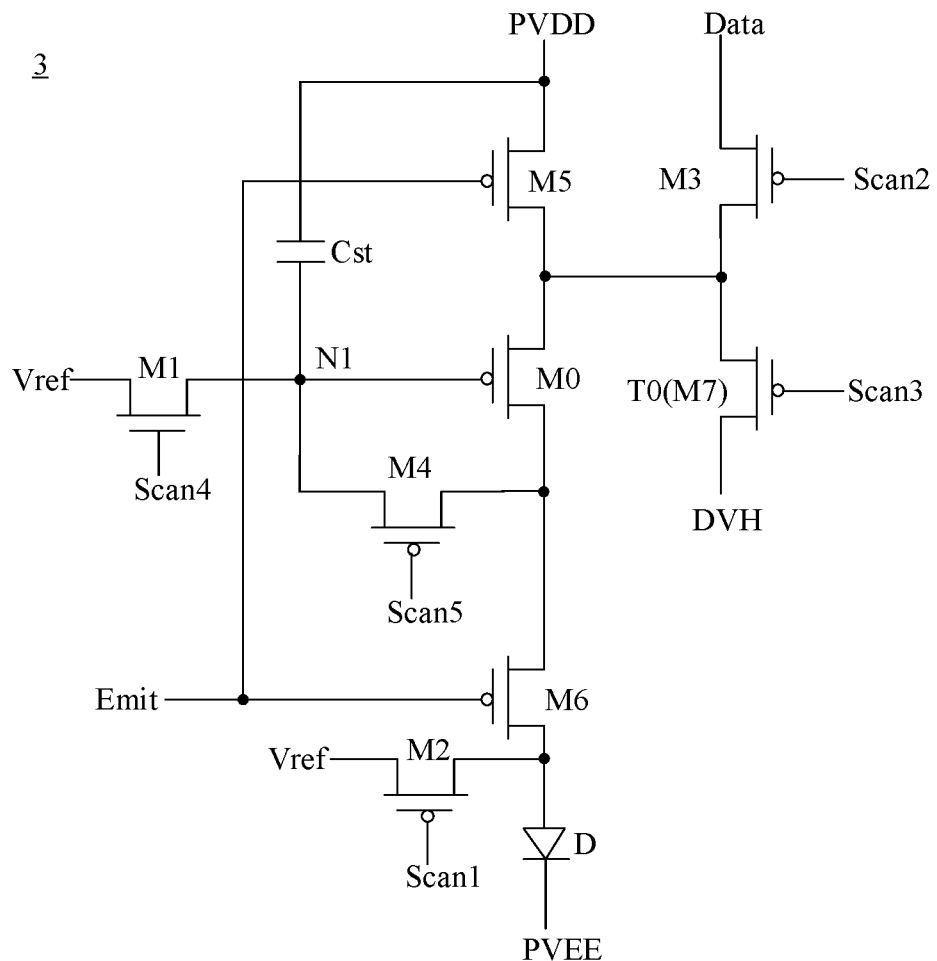
FIG. 14 is a schematic diagram of a pixel circuit according to another embodiment of the present disclosure.
Figure 15:
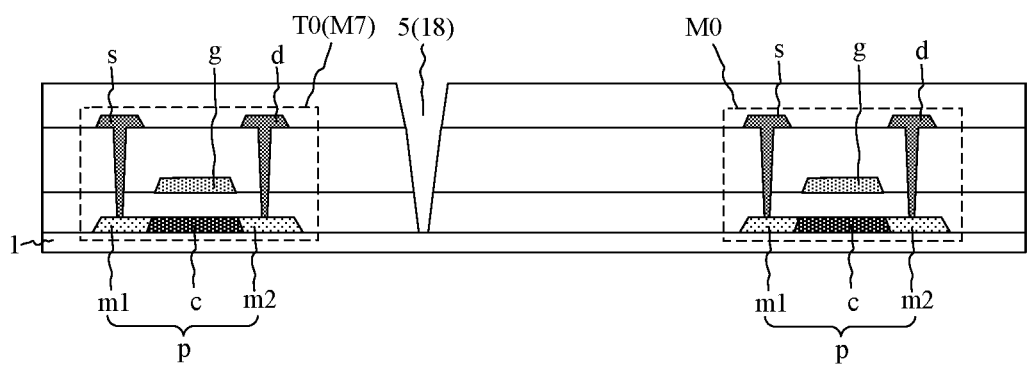
FIG. 15 is a cross-sectional view of a display panel according to another embodiment of the present disclosure.

In an embodiment, as shown in FIGS. 14 and 15, FIG. 14 is another schematic diagram of the pixel circuit 3 provided by some embodiments of the present disclosure, and FIG. 15 is a cross-sectional view of a display panel according to another embodiment of the present disclosure. The first switching transistor T0 includes a bias transistor M7 electrically connected between the bias signal line DVH and the first electrode of the driving transistor M0. The gate of the bias transistor M7 is electrically connected to the third scanning signal line Scan3, the first electrode of the bias transistor M7 is electrically connected to the bias signal line DVH, and the second electrode of the bias transistor M7 is electrically connected to the first electrode of the driving transistor M0. The bias transistor M7 is configured to turn on during the holding period, and transmit the bias voltage provided by the bias signal line DVH to the first electrode of the driving transistor M0, so as to stabilize the potential of the first electrode of the driving transistor M0.

The first via 5 can include a fourth sub-via 18, and in the direction perpendicular to the substrate 1, a distance between the fourth sub-via 18 and the channel c of the driving transistor M0 closest to the fourth sub-via 18 is greater than a preset distance, and a distance between an edge of the fourth sub-via 18 and the edge of the channel c of the bias transistor M7 closest thereto is smaller than the preset distance, so that the threshold voltage of the bias transistor M7 is negative by using the fourth sub-via 18, without affecting the threshold voltage of the driving transistor M0, thereby preventing the bias signal line DVH from leaking electricity to the driving transistor M0, and improving the reliability of the operating state of the driving transistor M0.

Referring to FIG. 14, in order to reduce the influence of the leakage current on the gate potential of the driving transistor M0, the gate reset transistor M1 and the threshold compensation transistor M4 in the pixel circuit 3 can also be set as low-leakage metal oxide transistors, such as an indium gallium zinc oxide (IGZO) transistor, at this time, the gate of the gate reset transistor M1 is electrically connected to the fourth scanning signal line Scan4, and the threshold compensation transistor M4 is electrically connected to the fifth scanning signal lines Scan5.

Figure 16:
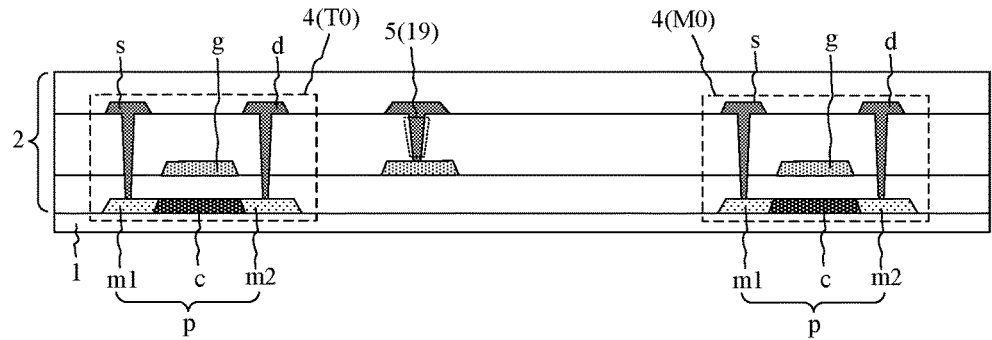
FIG. 16 is a schematic diagram of a first via according to another embodiment of the present disclosure.

FIG. 16 is another schematic diagram of a first via 5 provided in some embodiments of the present disclosure. In an embodiment, as shown in FIG. 16, the first via 5 includes a conduction via 19 filled with a metal material.

The first via 5 of this type can be a via in the array layer 2 for electrically connecting different metal layers to each other, that is, the original connection vias in the panel. In this case, the location of only this first via 5 is to be regulated, the threshold voltage of the first switching transistor T0 can be negative by using this first via 5, without affecting the threshold voltage of the driving transistor M0 at the same time.

It should be noted that, referring to FIG. 13, a connection via 19 can be the first connection via 10, the second connection via 14, and/or the third connection via 17.

In an embodiment, referring to FIG. 4 again, the first via 5 includes a dummy via 20 filled with an insulating material, that is, the first via 5 of this type is an additional layer provided in the array layer 2, and is not used to realize the electrical connection between the metal layers.

Figure 17:
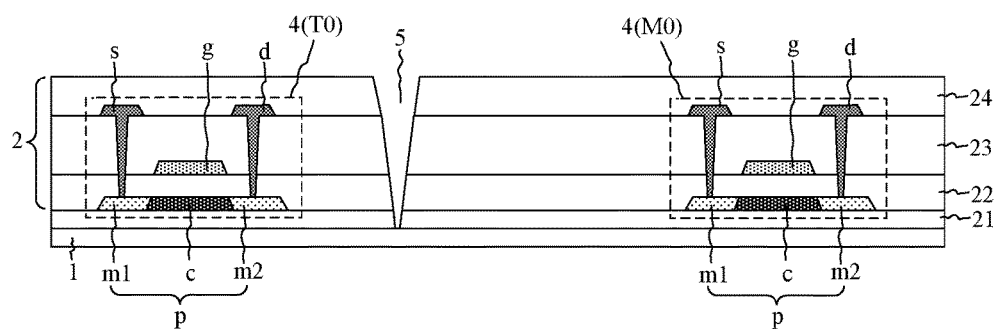
FIG. 17 is a schematic diagram of a first via according to another embodiment of the present disclosure.

In an embodiment, as shown in FIG. 17, which is another schematic diagram of a first via 5 provided in some embodiments of the present disclosure, the transistor can include a gate g at a side of an active layer p facing away from the substrate 1, and a first electrode s and a second electrode d that are located at a side of the gate g facing away from the substrate 1.

The array layer 2 can includes a buffer layer 21, a gate insulation layer 22, an interlayer dielectric layer 23, and a planarization layer 24. The buffer layer 21 is located between the active layer p and the substrate 1 and is configured to realize protection functions such as heat dissipation. The gate insulation layer 22 is located between the active layer p and the gate g. The interlayer dielectric layer 23 is located between the gate g and the first electrode s, and between the gate g and the second electrode d. The planarization layer 24 is located at a side of the first electrode s and the second electrode d that face away from the substrate 1 and is configured to realize the planarization of the layer. At least one first via 5 penetrates through at least two adjacent layers selected from the buffer layer 21, the gate insulation layer 22, the interlayer dielectric layer 23, and the planarization layer 24.

In this case, the first via 5 is relatively deep, and the discharge degree of hydrogen element is relatively large, so the negative regulation effect of the first via 5 on the threshold voltage of the first switching transistor T0 is more obvious, and the threshold voltage of the first switching transistor T0 is guaranteed to be negative in a greater extent.

In some embodiments, referring to FIG. 17 again, at least one first via 5 penetrates through the buffer layer 21, the gate insulation layer 22, the interlayer dielectric layer 23, and the planarization layer 24, so that this first via 5 has a relatively large depth, thereby achieving a good negative regulation effect on the threshold voltage of the first switching transistor T0.

Figure 18:
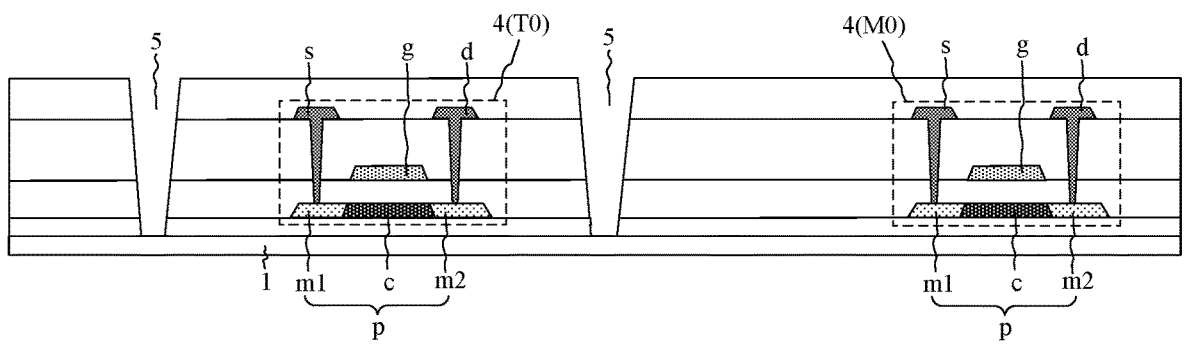
FIG. 18 is a schematic diagram of a first via according to another embodiment of the present disclosure.

In an embodiment, as shown in FIG. 18, FIG. 18 is another schematic diagram of a first via 5 provided in some embodiments of the present disclosure. In a direction perpendicular to the substrate, multiple vias 5 surround the first switching transistor T0, thereby exhausting the hydrogen elements near the channel c of the first switching transistor T0 in all directions, and exerting a relatively large reverse bias influence on the threshold voltage of the first switching transistor T0.

Figure 19:
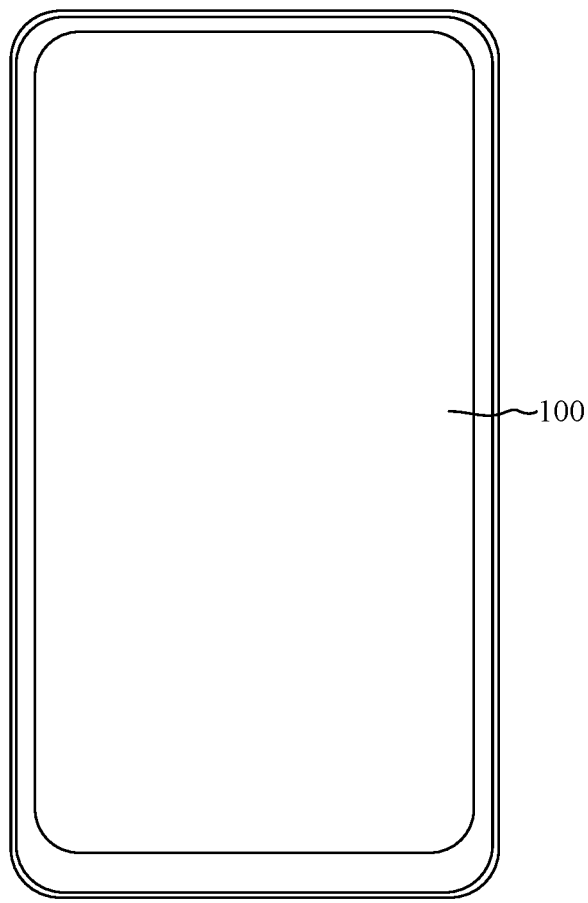
FIG. 19 is a schematic diagram of a display apparatus provided by some embodiments of the present disclosure.

Some embodiments of the present disclosure also provide a display apparatus. FIG. 19 is a schematic diagram of a display apparatus provided by some embodiments of the present disclosure. As shown in FIG. 19, the display apparatus includes the above display panel 100. The specific structure of the display panel 100 has been described in detail in the embodiments mentioned above, and will not be repeated herein. It is appreciated that, the display apparatus shown in FIG. 19 is only a schematic illustration, and the display apparatus can be any electronic device with a display function, such as a mobile phone, a tablet computer, a notebook computer, an electronic paper book, or a television.

The above are merely some embodiments of the present disclosure, which, as mentioned above, are not used to limit the present disclosure. Whatever within the principles of the present disclosure, including any modification, equivalent substitution, improvement, etc., shall fall into the protection scope of the present disclosure.

Finally, it should be noted that the technical solutions of the present disclosure are illustrated by the above embodiments, but not intended to limit thereto. Although the present disclosure has been described in detail Referring to the foregoing embodiments, those skilled in the art can understand that the present disclosure is not limited to the specific embodiments described herein, and can make various obvious modifications, readjustments, and substitutions without departing from the scope of the present disclosure.

What is claimed is:

1. A display panel, comprising:
a substrate; and
an array layer located at a side of the substrate,
wherein the array layer comprises:
pixel circuits each comprising transistors, wherein each of the transistors comprises an active layer, wherein the active layer comprises a channel; and the transistors comprise a driving transistor and a first switching transistor; and
at least first vias, wherein in a direction perpendicular to the substrate, a distance between one of the at least first vias and the channel of the driving transistor of one of the pixel circuits that is closest to the one of the at least first vias is greater than a preset distance, and a distance between an edge of of the at least first vias and an edge of the channel of the first switching transistor of one of the pixel circuits that is closest to the one first via is smaller than the preset distance;
wherein the first switching transistor comprises a threshold compensation transistor electrically connected between a second electrode of the driving transistor and a gate of the driving transistor;
wherein the at least first vias comprise a second sub-via; and, in the direction perpendicular to the substrate, a distance between the second sub-via and the channel of the driving transistor closest to the second sub-via is greater than the preset distance, and a distance between the edge of the second sub-via and the edge of the channel of the threshold compensation transistor closest to the second sub-via is smaller than the preset distance;
wherein the threshold compensation transistor is electrically connected to the gate of the driving transistor through a second connection line and a third connection line; and
wherein the second sub-via comprises a second connection via electrically connected between the second connection line and the third connection line.

2. The display panel according to claim 1, wherein the preset distance is L, and 10 μm≤L≤20 μm.

3. The display panel according to claim 2, wherein L=10 μm.

4. The display panel according to claim 1, wherein in the direction perpendicular to the substrate, one of the at least first vias does not overlap with the first switching transistor.

5. The display panel according to claim 1, wherein in the direction perpendicular to the substrate, one of the at least first vias is located in the channel of the active layer of the first switching transistor.

6. The display panel according to claim 1, wherein the active layer further comprises a first doping region and a second doping region; and the transistors further comprise a gate located at a side of the active layer facing away from the substrate, and a first electrode and a second electrode that are located at a side of the gate facing away from the substrate; and the display panel further comprises a second via and a third via, wherein the second via is electrically connected between the first electrode of the first switching transistor and the first doping region of the first switching transistor, and, in the direction perpendicular to the substrate, a distance between an edge of the second via and an edge of the channel in the active layer electrically connected to the second via is smaller than the preset distance; and the third via is electrically connected between the second electrode of the first switching transistor and the second doping region of the first switching transistor, and, in the direction perpendicular to the substrate, a distance between an edge of the third via and an edge of the channel in the active layer electrically connected to the third via is smaller than the preset distance.

7. The display panel according to claim 1, wherein, in the direction perpendicular to the substrate, a distance between the channel of the driving transistor and one of the at least first vias that does not overlap with the driving transistor is greater than the preset distance.

8. The display panel according to claim 1, wherein the first switching transistor of one of the pixel circuits comprises a first switching sub-transistor, the driving transistor of one of the pixel circuits comprises a first driving sub-transistor, and the first switching sub-transistor is adjacent to the first driving sub-transistor; and wherein the preset distance L, a distance a' between the channel of the first switching sub-transistor and the channel of the first driving sub-transistor, and a distance d' between the channel of the first driving sub-transistor and one of the at least first vias closest to the channel of the first driving sub-transistor satisfy:

$a' \geq L$, and $L < d' < a' + L$.

9. The display panel according to claim 8, wherein the one of the pixel circuits comprising the first switching sub-transistor is adjacent to and different from the one of the pixel circuits comprising the first driving sub-transistor.

10. The display panel according to claim 1, wherein the first switching transistor of one of the pixel circuits comprises a first switching sub-transistor, the driving transistor of one of the pixel circuits comprises a first driving sub-transistor, and the first switching sub-transistor is adjacent to the first driving sub-transistor; and wherein the preset distance L, a distance a' between the channel of the first switching sub-transistor and the channel of the first driving sub-transistor, and a distance d' between the channel of the first driving sub-transistor and one of the at least first vias closest to the channel of the first driving sub-transistor satisfy:

$a' > L, d' \geq a' - L$, and $d' > L$.

11. The display panel according to claim 1, wherein the first switching transistor of one of the pixel circuits comprises a first switching sub-transistor, the driving transistor of one of the pixel circuits comprises a first driving sub-transistor, and the first switching sub-transistor is adjacent to the first driving sub-transistor; and wherein the preset distance L, a distance a' between the channel of the first switching sub-transistor and the channel of the first driving sub-transistor, and a distance d' between the channel of the first driving sub-transistor and one of the at least first vias closest to the channel of the first driving sub-transistor satisfy:

$a' < L$, and $L < d' < a' + L$.

12. The display panel according to claim 11, wherein the one of the pixel circuits comprising the first switching sub-transistor is a same as the one of the pixel circuits comprising the first driving sub-transistor.

13. The display panel according to claim 1, wherein the first switching transistor comprises a data writing transistor electrically connected between a data line and a first electrode of the driving transistor; and wherein the at least first vias comprise a first sub-via; and, in the direction perpendicular to the substrate, a distance between the first sub-via and the channel of the driving transistor closest to the first sub-via is greater than the preset distance, and a distance between an edge of the first sub-via and an edge of the channel of the data writing transistor closest to the first sub-via is smaller than the preset distance.

14. The display panel according to claim 13, wherein the data writing transistor is electrically connected to the data line through a first connection line; and wherein the first sub-via comprises a first connection via electrically connected between the first connection line and the data line.

15. The display panel according to claim 1, wherein the first switching transistor comprises a light-emitting control transistor connected between a second electrode of the driving transistor and a light-emitting element; and wherein the at least first vias comprise a third sub-via; and, in the direction perpendicular to the substrate, a distance between the third sub-via and the channel of the driving transistor closest to the third sub-via is greater than the preset distance, and a distance between an edge of the third sub-via and an edge of the channel of the light-emitting control transistor closest to the third sub-via is smaller than the preset distance.

16. The display panel according to claim 15, wherein the light-emitting control transistor is electrically connected to the light-emitting element through a fourth connection line; and wherein the third sub-via comprises a third connection via electrically connected between the fourth connection line and the light-emitting element.

17. The display panel according to claim 1, wherein the first switching transistor comprises a bias transistor electrically connected between a bias signal line and a first electrode of the driving transistor; and wherein the at least first vias comprise a fourth sub-via; and in the direction perpendicular to the substrate, a distance between the fourth sub-via and the channel of the driving transistor closest to the fourth sub-via is greater than the preset distance, and a distance between an edge of the fourth sub-via and an edge of the channel of the bias transistor closest to the fourth sub-via is smaller than the preset distance.

18. The display panel according to claim 1, wherein the at least first vias comprise a conduction via filled with a metal material.

19. The display panel according to claim 1, wherein the at least first vias comprise a dummy via filled with an insulating material.

20. The display panel according to claim 1, wherein one of the transistors further comprises a gate located at a side of the active layer facing away from the substrate, and a first electrode and a second electrode that are located at a side of the gate facing away from the substrate;
   wherein the array layer further comprises:
      a buffer layer located between the active layer and the substrate,
      a gate insulation layer located between the active layer and the gate,
      an interlayer dielectric layer located between the gate and each of the first electrode and the second electrode, and
      a planarization layer located at a side of the first electrode and the second electrode facing away from the substrate;
   wherein one of the at least first vias penetrates through at least two adjacent layers selected from the buffer layer, the gate insulation layer, the interlayer dielectric layer, or the planarization layer.

21. The display panel according to claim 20, wherein the one of the at least first vias penetrates through the buffer layer, the gate insulation layer, the interlayer dielectric layer, and the planarization layer.

22. The display panel according to claim 1, wherein the at least first vias comprise a plurality of first vias, and the plurality of the first vias surrounds the first switching transistor in the direction perpendicular to the substrate.

23. A display apparatus, comprising a display panel, wherein the display panel comprises:
   a substrate; and
   an array layer at a side of the substrate,
   wherein the array layer comprises:
      pixel circuits each comprising transistors, wherein each of the transistors comprises an active layer, wherein the active layer comprises a channel; and the transistors comprise a driving transistor and a first switching transistor; and
   at least first vias, wherein in a direction perpendicular to the substrate, a distance between one of the at least first vias and the channel of the driving transistors of one of the pixel circuits that is closest to the one of the at least first vias is greater than a preset distance, and a distance between an edge of one of the at least first vias and an edge of the channel of the first switching transistor of one of the pixel circuits that is closest to the one first via is smaller than the preset distance;
   wherein the first switching transistor comprises a threshold compensation transistor electrically connected between a second electrode of the driving transistor and a gate of the driving transistor;
   wherein the at least first vias comprise a second sub-via; and, in the direction perpendicular to the substrate, a distance between the second sub-via and the channel of the driving transistor closest to the second sub-via is greater than the preset distance, and a distance between the edge of the second sub-via and the edge of the channel of the threshold compensation transistor closest to the second sub-via is smaller than the preset distance;
   wherein the threshold compensation transistor is electrically connected to the gate of the driving transistor through a second connection line and a third connection line; and
   wherein the second sub-via comprises a second connection via electrically connected between the second connection line and the third connection line.

* * * * *